US007862396B2

(12) United States Patent
Lee

(10) Patent No.: US 7,862,396 B2
(45) Date of Patent: Jan. 4, 2011

(54) FLAT PANEL DISPLAY DEVICE AND FABRICATION APPARATUS THEREOF AND FABRICATION METHOD THEREOF

(75) Inventor: Jong Woo Lee, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 743 days.

(21) Appl. No.: 11/636,862

(22) Filed: Dec. 11, 2006

(65) Prior Publication Data

US 2007/0195634 A1 Aug. 23, 2007

(30) Foreign Application Priority Data

Feb. 14, 2006 (KR) .................. 10-2006-0014325
Feb. 20, 2006 (KR) .................. 10-2006-0016427

(51) Int. Cl.
*H01J 9/26* (2006.01)
(52) U.S. Cl. .............................. 445/25; 445/24; 445/66
(58) Field of Classification Search ................... 445/24, 445/25, 65
See application file for complete search history.

(56) References Cited

U.S. PATENT DOCUMENTS 6,109,994 A * 8/2000 Cho et al. .................... 445/25
6,517,403 B1 * 2/2003 Cooper et al. ................ 445/25
6,555,025 B1 4/2003 Krupetsky et al.
6,582,875 B1 * 6/2003 Kay et al. .................... 430/200
6,998,776 B2 2/2006 Aitken et al.
7,485,337 B2 * 2/2009 Nguyen et al. ................ 427/66
2002/0024096 A1 * 2/2002 Yamazaki et al. ........... 257/359
2005/0233885 A1 10/2005 Yoshida et al.
2005/0247685 A1 * 11/2005 Tanaka et al. ......... 219/121.82
2006/0228975 A1 * 10/2006 Miura ......................... 445/24
2007/0001579 A1 * 1/2007 Jeon et al. ................... 313/495

FOREIGN PATENT DOCUMENTS

JP 2000-026127 1/2000
JP 2004-172048 6/2004

OTHER PUBLICATIONS

Japanese Office Action issued Jan. 19, 2010 in corresponding Patent Application 2006-236172.

* cited by examiner

*Primary Examiner*—Bumsuk Won
(74) *Attorney, Agent, or Firm*—Knobbe Matens Olson & Bear LLP

(57) ABSTRACT

Disclosed is a method of making a flat panel display device. The device has a first substrate, a second substrate opposing the first substrate and an array of pixels formed therebetween. A frit is interposed and interconnects between the first substrate and second substrate. The frit is melted by irradiating a first laser and a second laser. The first and second lasers move along the different paths.

16 Claims, 7 Drawing Sheets

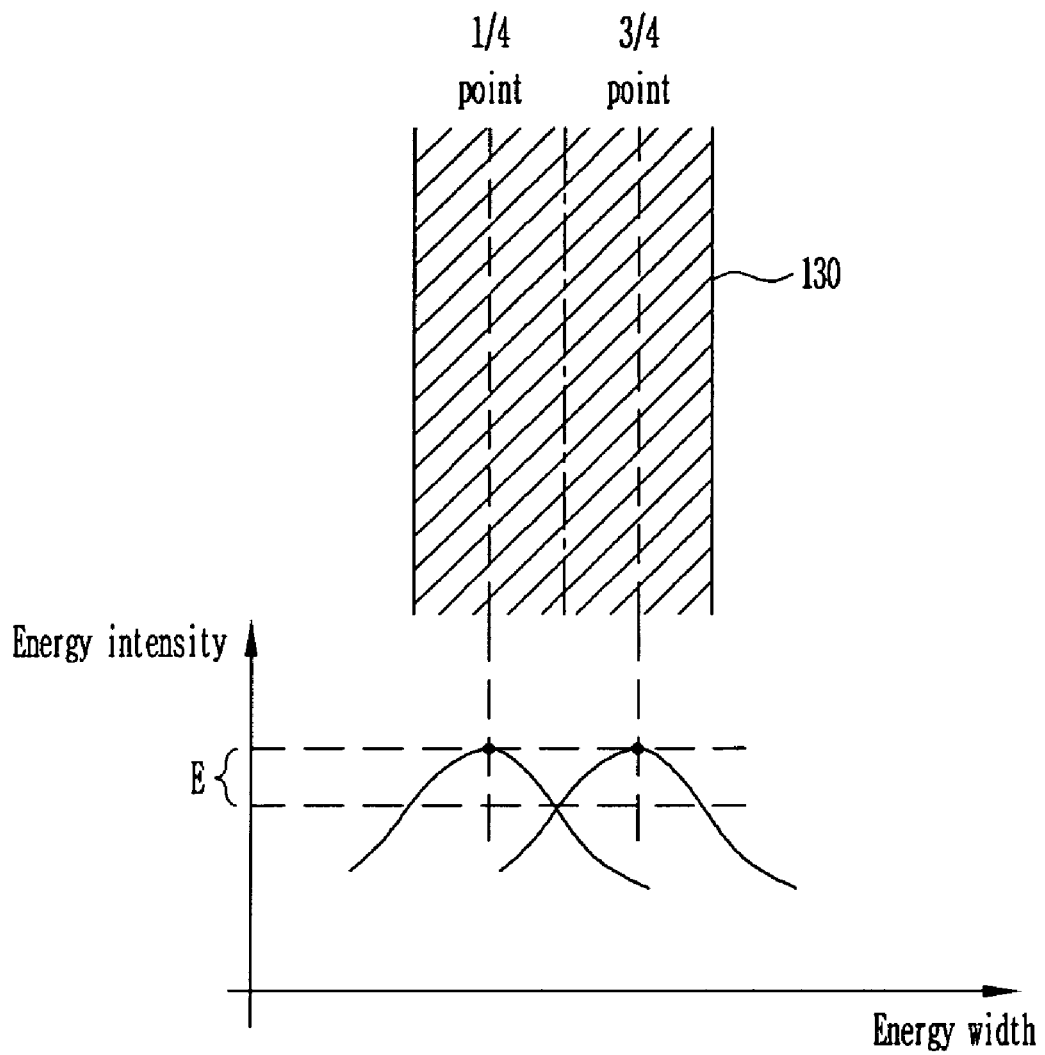

FLAT PANEL DISPLAY DEVICE AND FABRICATION APPARATUS THEREOF AND FABRICATION METHOD THEREOF

CROSS-REFERENCE TO RELATED APPLICATIONS

This application claims the benefit of Korean Patent Application Nos. 10-2006-0014325, filed Feb. 14, 2006 & 10-2006-0016427, filed Feb. 20, 2006, in the Korean Intellectual Property Office, the disclosure of which is incorporated herein by reference in their entirety.

BACKGROUND

1. Field of the Invention

The present invention relates to a flat panel display device, and more particularly, to encapsulating a flat panel display device.

2. Discussion of Related Art

Recently, various flat panel display devices capable of reducing weight and volume, which are disadvantages of a cathode ray tube (CRT), have been developed. As the flat panel display device, there are a liquid crystal display, a field emission display, a plasma display panel and a light emitting display, etc. There have widely been studied the flat panel display devices since they can be constituted in super thin and flexible form in terms of driving characteristic. Among others, since the field emission display has the characteristic that is degraded by an infiltration of moisture, it needs a sealing member for preventing the infiltration of moisture.

Generally, there is a method fabricating a sealing member by machining a metal can or a glass substrate in a cap form to have a groove, wherein after a desiccant for absorbing moisture is mounted in the groove in a powder form or fabricated in a film form to be adhered to it using a double-faced tape, the sealing member is bonded to the substrate on which the organic light emitting elements are formed, using UV curing sealant or thermosetting sealant. That is, according to the exemplary method, although the sealing member is bonded to the substrate on which the elements are formed, using the UV curing sealant or the thermosetting sealant, there may be a limitation to prevent the infiltration of oxygen or moisture since the bonding material is sealant.

In case that oxygen or moisture is infiltrated into inside of the elements, it has disadvantages that degradation due to intrinsic factors, such as degradation of an emission layer due to oxygen from a first electrode ITO, degradation due to a reaction of the emission to an interface, etc., as well as degradation due to extrinsic factors, such as moisture, oxygen, ultraviolet rays, and fabrication conditions of the elements, etc., easily occur. That is, it causes problems that due to the infiltration of moisture from the external into the inside of a display unit, the emission layer is separated from an electrode and poor pixels are generated, etc.

The structure sealing the organic light emitting display device by applying the frit on the glass substrate is disclosed in U.S. Pat. No. 6,998,776, wherein it uses the frit and melts it by a laser so that the gap between the substrate for the elements and the cap is sealed.

The discussion in this section is to provide general background information, and does not constitute an admission of prior art.

SUMMARY

One aspect of the invention provides a method of making a flat panel display device. The method comprises: providing an unfinished product comprising: a first substrate, a second substrate opposing the first substrate, an array of pixels interposed between the first and second substrates, and a frit comprising a plurality of elongated segments, which forms a closed loop surrounding the array and interposed between the first and second substrates. The plurality of elongated segments comprises a first elongated segment extending generally in a first direction, and the first elongated segment comprises a first surface, which contacts the first substrate. The method further comprises applying a first laser beam to the first elongated segment while moving the first laser beam relative to the first elongated segment, whereby the first laser beam moves generally along the first direction while illuminating a first strip of the first surface, wherein the first strip of the first surface extends generally in the first direction; and applying a second laser beam to the first elongated segment while moving the second laser beam relative to the first elongated segment, whereby the second laser beam moves while illuminating a second strip of the first surface.

In the foregoing method, applying the first and second laser beams may be carried out substantially simultaneously. Applying the first and second laser beams may be carried out using an apparatus comprising: a first laser source irradiating the first laser beam; a second laser source irradiating the second laser beam; and a support coupled to the first and second laser sources and configured to simultaneously move the first and second laser sources along the first direction. Applying the second laser beam may be carried out subsequent to applying the first laser beam. The first and second strips may overlap with each other. The first and second strips do not may overlap with each other. The first beam may be larger than the second beam. The first strip has a first central line extending generally in the first direction, and wherein the first central line may be located within the second strip.

Still in the foregoing method, the first strip has a first central line extending generally in the first direction, wherein the second strip has a second central line extending generally in the first direction. The first surface has a first edge and a second edge, which may be substantially parallel to each other and extend generally in the first direction, and wherein the first central line and second central line may be located between the first and second edges. The first surface has a width, which is a distance between the first and second edges in a second direction, wherein the first central line and the first edge has a first distance therebetween in the second direction, and wherein the first distance may be from about one eighth to about three eighth of the width. The first surface has a width, which is a distance between the first and second edges in a second direction, wherein the second central line and the first edge has a second distance therebetween in the second direction, and wherein the second distance may be from about five eighth to about seven eighth of the width. Applying the first laser beam may cause to melt a portion of the first elongated segment. The method further comprises applying a third laser beam to the first elongated segment while moving the third laser beam relative to the first elongated segment, whereby the third laser beam moves while illuminating a third strip of the first surface.

Another aspect of the invention provides a flat panel display device produced by a method comprising the foregoing method. The first surface may be bonded to the first substrate. An interface between the first elongated segment and the first substrate comprises a first trace of illumination of the first laser beam and a second trace of illumination of the second laser beam. The first trace of illumination comprises a color gradient generally in a direction perpendicular to the first central line. The first trace of illumination comprises a morphology difference of the frit generally in a direction perpendicular to the first central line.

A further aspect of the invention provides an apparatus of making a flat panel display device according to the foregoing method. The apparatus comprises: a first laser source irradiating the first laser beam; a second laser source irradiating the second laser beam; and a support coupled to the first and second laser sources and configured to move the first and second laser sources along the first direction. The support is configured to move the first and second laser sources simultaneously.

An aspect of the present invention provides a flat panel display device and fabrication method thereof for bonding a substrate on which elements are formed to a sealing member by melting the frit pattern formed on the sealing member and preventing a frit pattern from incompletely being melted by irradiating the frit pattern along at least two paths with laser when melting it.

Another aspect of the present invention provides a fabrication apparatus of a flat panel display device for preventing a frit pattern from incompletely being melted and cured by irradiating the frit pattern along at least two paths with laser when melting and bonding it.

An aspect of the invention provides a flat panel display device comprising: a substrate on which a plurality of light emitting elements are formed; a sealing member positioned on the substrate to be opposite to one side of the substrate on which the light emitting elements are formed; and a frit pattern bonding the substrate to the sealing member, wherein the frit pattern is melted by being irradiated along at least two paths with laser.

An aspect of the invention provides a fabrication method of a flat panel display device comprising: forming a plurality of light emitting elements on one side of a substrate; preparing a sealing member to be opposite to the one side of the substrate; applying a frit pattern to one side of the sealing member toward the substrate and bonding the frit pattern to the substrate; and melting the frit pattern by irradiating it along at least two paths with laser and bonding the substrate to the sealing member by curing the melted frit pattern.

An aspect of the invention provides a fabrication apparatus comprising a first and second substrates and a mask on a substrate stage and melting a frit pattern formed on a predetermined region of the second substrate, the apparatus comprising: two or more neighboring laser heads allowing laser to be irradiated along at least two paths on the frit pattern; a laser head guide supporting the laser head and allowing the laser head to move the frit pattern region; at least one first alignment unit comprising a first CCD attached to one region of the laser head guide to measure the positions of the substrate and the mask and aligning the substrate and the mask; and a second alignment unit comprising a second CCD attached to the one region of the laser head to measure the position of the laser head and aligning the substrate and the laser head.

BRIEF DESCRIPTION OF THE DRAWINGS

These and other aspects and advantages of the invention will become apparent and more readily appreciated from the following description of the embodiments, taken in conjunction with the accompanying drawings of which:

FIGS. 2A and 2B are waveform diagrams of laser energy irradiated when melting a frit pattern;

DETAILED DESCRIPTION OF EMBODIMENTS

Hereinafter, various embodiments of the present invention will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5A:
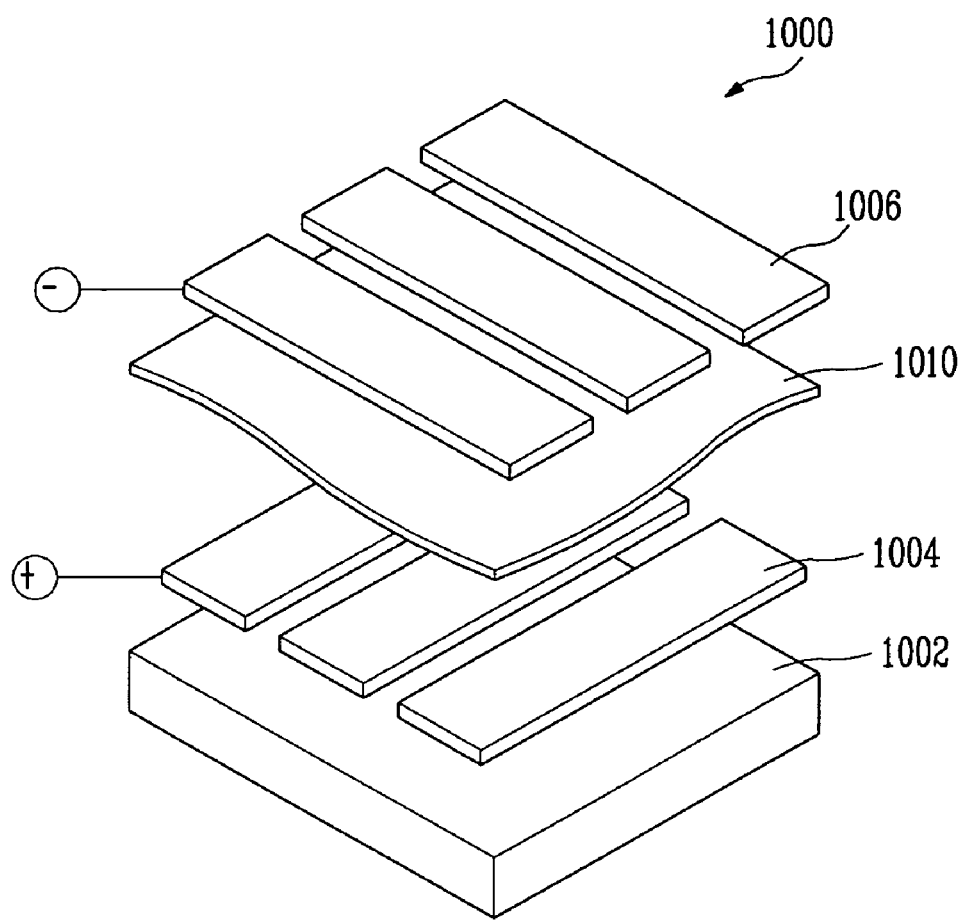
FIG. 5A is a schematic exploded view of a passive matrix type organic light emitting display device in accordance with one embodiment.
Figure 5B:
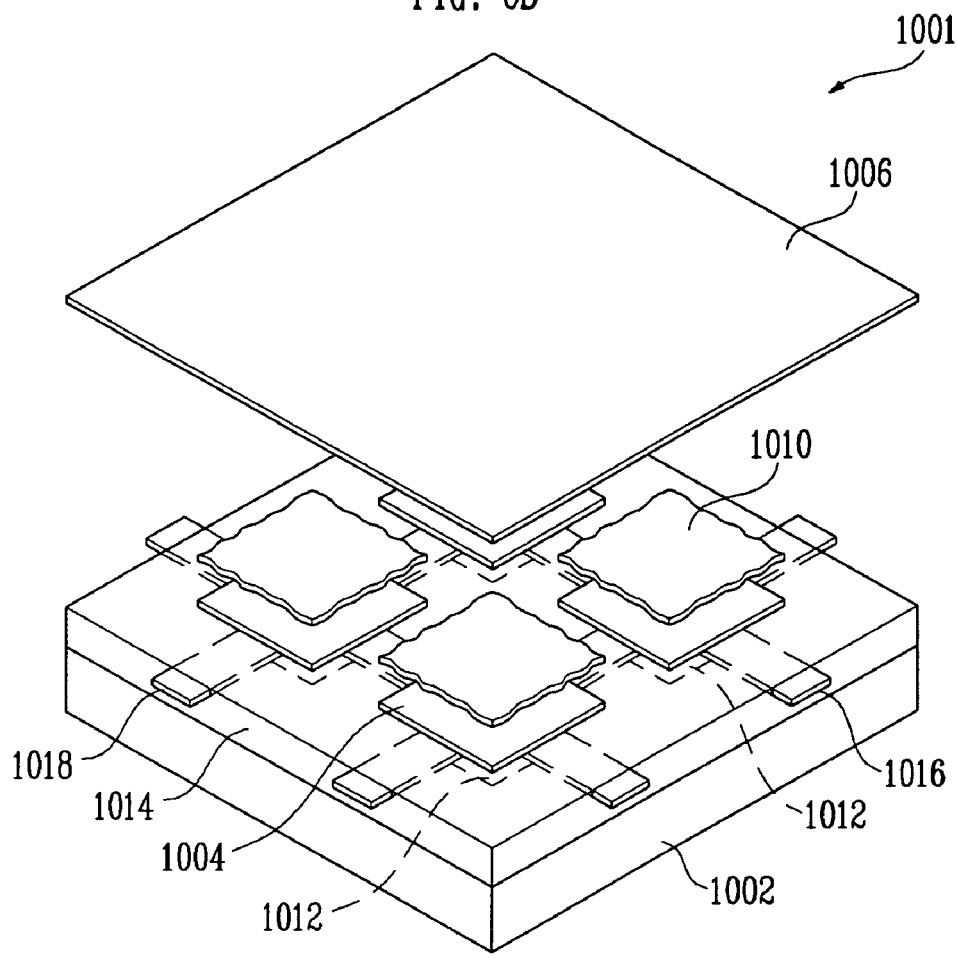
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
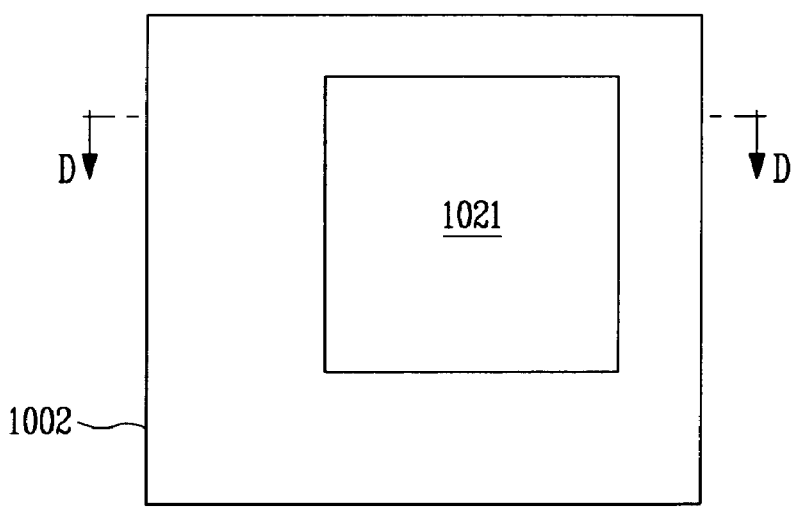
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
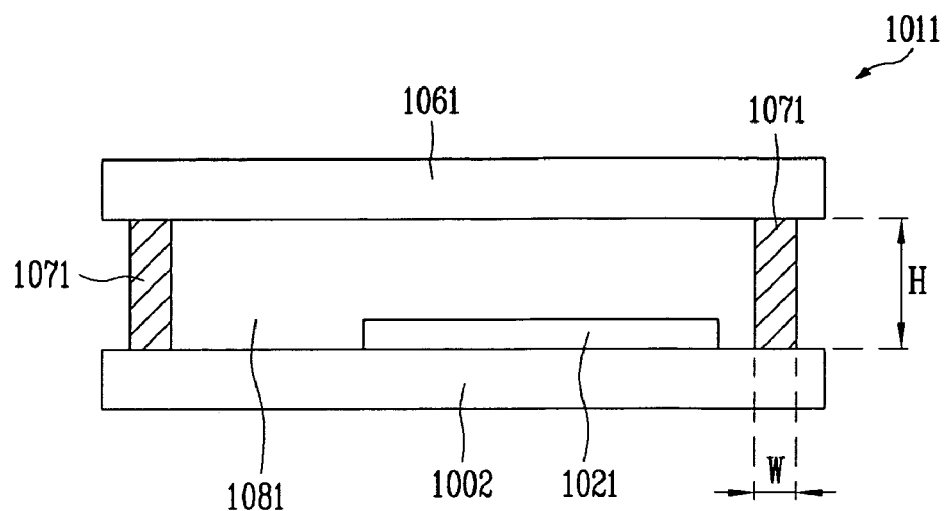
FIG. 5D is a cross-sectional view of the organic light emitting display of FIG. 5C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 5E:
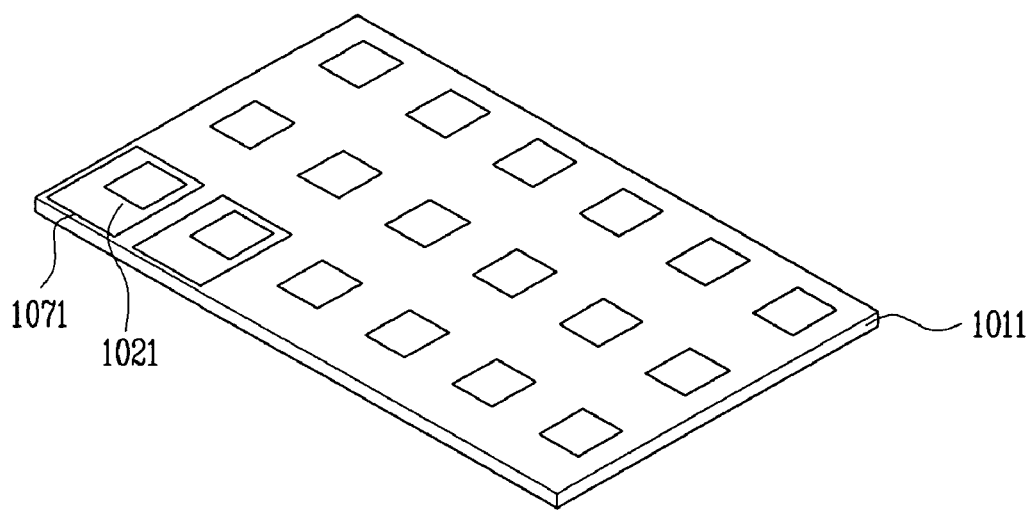
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

When irradiating the frit pattern with the laser, the energy region of the laser capable of melting the frit pattern, including points where the laser is irradiated, may be smaller than the width of the frit pattern. As a result, the edge region of the frit pattern at which the energy of the laser is not arrived is incompletely melted so that there is risk of inducing an incomplete curing. When the incomplete curing is induced, it has problems that oxygen or moisture is infiltrated so that the emission layer included in the light emitting unit is separated from an electrode and poor pixels are generated, etc.

Figure 1:
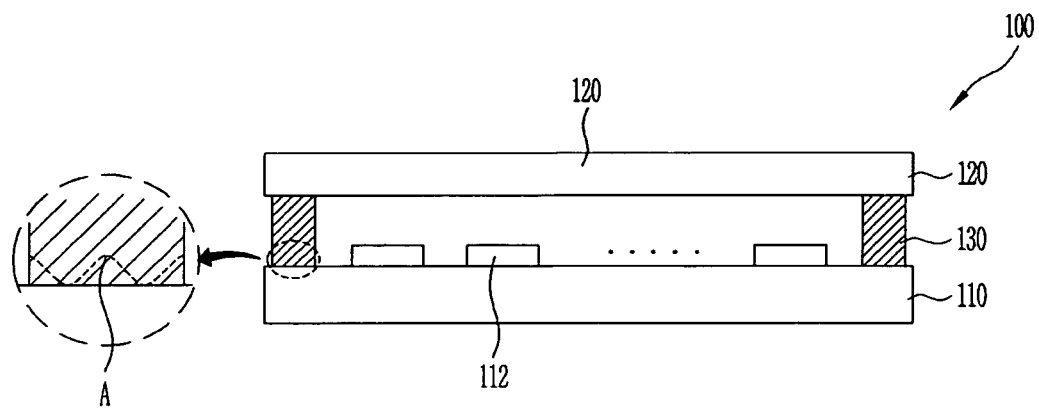
FIG. 1 is a cross section diagram showing a flat panel display device according to an embodiment of the present invention.

FIG. 1 is a cross section diagram showing a flat panel display device according to an embodiment of the present invention. However, although the flat panel display device according to the embodiment of the present invention describes an organic light emitting display device as one example, the flat panel display device according to embodiments of the present invention is not limited thereto. Also, although the frit generally means glass of powder state, the frit according to some embodiments of the present invention means glass of gel state that organic matter is added to the glass of the powder state and glass of solid state cured by irradiating the glass of the powder state with laser.

Referring to FIG. 1, the flat panel display device 100 according to the embodiment of the present invention comprises a substrate 110 on which a plurality of light emitting elements 112 are formed; a sealing member 120 positioned on the substrate to be opposite to one side of the substrate 110 on which the light emitting elements 112 are formed; and a frit pattern 130 bonding the substrate to the sealing member. At this time, the frit pattern 130 is formed along an edge side of the sealing member 120, wherein it is cured by being melted after being bonded to the substrate so that it functions to bond the substrate 100 to the sealing member 120. The embodiment of the present invention is characterized by preventing an incomplete melting of the frit pattern by irradiating it along at least two paths with laser, when melting the frit pattern 130

Although a few embodiments of the present invention have been shown and described, it would be appreciated by those skilled in the art that changes might be made in this embodiment without departing from the principles and spirit of the invention, the scope of which is defined in the claims and their equivalents. Further, although in some embodiments of the present invention, the sealing member 120 may be a substrate of glass material, it is not necessarily limited thereto; however, it may be consisted of plastic or a metal cap, etc. Also, although the substrate 110 may be consisted of a transparent glass, it is not limited thereto; however, it may be consisted of plastic material.

A plurality of the light emitting elements 112 formed on the substrate 100 may be organic light emitting elements. The light emitting element 112 comprises a pair of electrodes opposed to each other and an organic layer having at least organic emission layer inserted between the electrodes. At this time, the organic light emitting unit can be driven in both a passive matrix and an active matrix. The organic light emitting element 112 is configured of an anode electrode supplying holes and a cathode electrode supplying electrons, wherein the anode electrode is arranged to be opposite to the cathode electrode, and a organic emission layer disposed between the anode electrode and the cathode electrode.

In general, although the anode electrode is formed on the substrate 110, the organic layer on the substrate, and the cathode electrode on the organic layer, it is not necessarily limited thereto; however, the position of the anode electrode and the cathode electrode may be reversed. In case that an image is a rear emitting type implemented toward the substrate 110, the anode electrode can be formed in a transparent electrode and the cathode electrode formed in a reflective electrode. In case that an image is a front emitting type implemented toward the opposite side of the substrate, the anode electrode can be formed in the reflective electrode and the cathode electrode formed in the transparent electrode. The anode electrode and the cathode electrode can be formed in a predetermined pattern. In case of an active emitting type, although the cathode electrode may be formed in a front deposition pattern, it is not necessarily limited thereto; however, it may be formed in other patterns.

The organic layer inserted between the anode electrode and the cathode electrode may be a low molecular organic layer or a high molecular organic layer. In case using the low molecular organic layer, a hole injection layer (HIL), a hole transport layer (HTL), an organic emission layer (EML), an electron transport layer (EIL), an electron transport layer (ETL), or the like may be stacked and formed in a single or a composite structure. As usable organic materials, there are copperphthalocyanine (CuPc), N,N-Di(naphthalene-1-1yl) -N,N'-diphenylbenzidine (NPB), tris-8-hydroxyquinoline aluminum (Alq3), etc. This low molecular organic layer may be formed in a vacuum deposition method. In case of the high molecular organic layer, it may be configured of a structure comprising a hole transport layer (HTL) and an emission layer (EML). At this time, as the hole transport layer is used PEDOT, and as the emission layer is used the high molecular organic materials of poly-phenylenevinylene (PPV) and polyfluroene, etc. The emission layer can be formed in a screen printing method or an ink jet printing method, etc.

In the organic layer, the at least emission layer is patterned by each pixel of red (R), green (G) and blue (B) to implement a full color. In the organic light emitting element 112, as the anode electrode and the cathode electrode are applied with a positive voltage and a negative voltage, the holes injected from the anode electrode are moved into the emission layer and the electrons are injected from the cathode electrode to the emission layer so that the holes and the electrons are recombined to generate exitons. Then, as the exitons are changed from excitation state to ground state, fluorescent molecules in the emission layer are light-emitted, thereby forming an image. In case of the full color organic light emitting display device, it implements the full-color by comprising a pixel light-emitting three colors of red (R), green (G) and blue (B).

Further, in case of the sealing member 120 facing with the substrate 110 on which a plurality of the light emitting elements 112 are formed, the frit pattern 130 is formed along the edge region of the sealing member 120, as shown. The frit pattern 130 is melted by the laser. In embodiments of the present invention, when melting the frit pattern 130, the laser is irradiated along at least two paths to prevent an incomplete melting of the frit pattern.

Figure 2A:
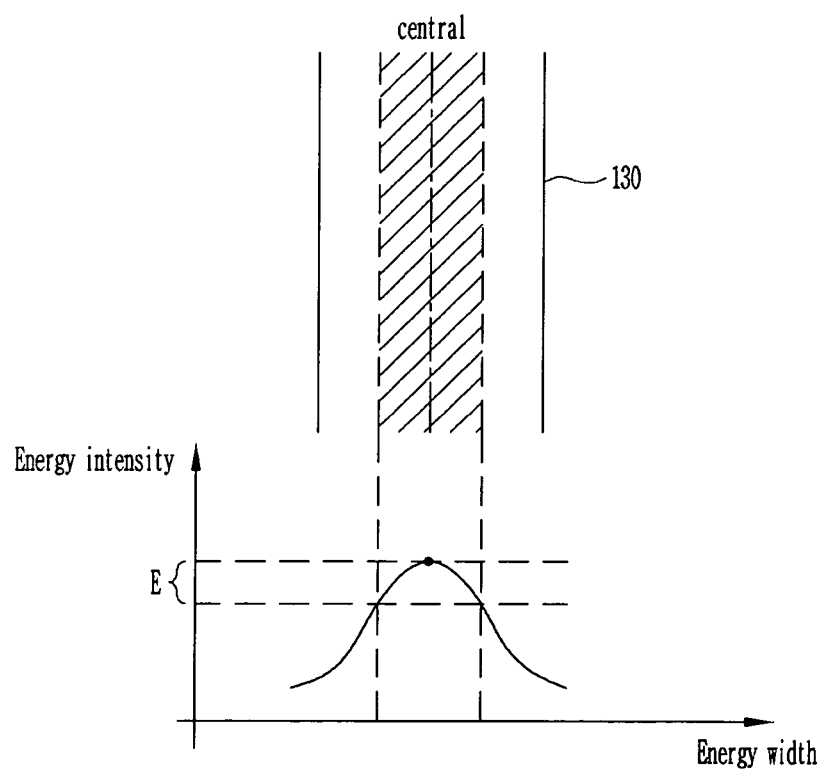

FIGS. 2A and 2B are exemplary diagrams of laser energy intensity irradiated and bonded region when melting a frit pattern. First, considering the general waveform of laser energy as shown in FIG. 2A, an energy region E capable of melting the frit pattern 130, including points where the laser is irradiated, is smaller than the width of the frit pattern formed on the sealing member. Therefore, when the laser is irradiated along the central part of the frit pattern 130, since the laser energy is not arrived at the edge region of the frit pattern 130, there is risk of inducing an incomplete melting. When the incomplete melting occurs, it causes problems that oxygen or moisture is infiltrated after the frit pattern is cured later so that the emission layer included in the light emitting element is separated from an electrode and poor pixels are generated, etc.

In order to avoid the above, as shown in FIG. 2b, in case that the embodiment of the present invention irradiates the laser having the energy waveform shown in FIG. 2A, the laser is irradiated along at least two paths when melting the frit pattern 130 so that the entire frit pattern 130 is included in the energy region E of the laser, thereby overcoming the problems as described above with reference to the FIG. 2A. That is, the incomplete melting of the frit patter can be prevented. As one example, when the laser is irradiated along the two paths, it is irradiated along one fourth point and three fourth point of the frit pattern so that the entire frit pattern 130 can be included in the effective energy region E of the laser. If the laser is irradiated along the at least two paths, the frit pattern 130 melted by the laser irradiation is formed to have at least one turning point A in the region bonded to the substrate, as shown in an magnified portion of FIG. 1.

Figure 3A:
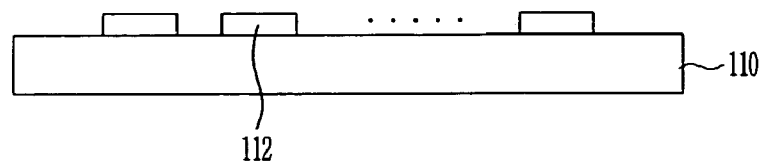
FIG. 3A to 3D are cross section diagrams showing a fabrication process of a flat panel display device according to an embodiment of the present invention.
Figure 3B:
Figure 3C:
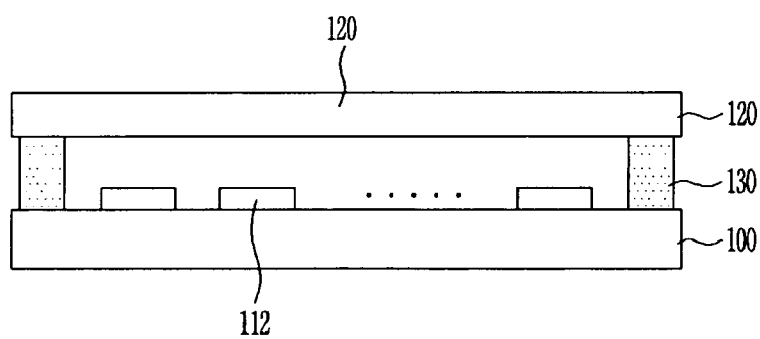
Figure 3D:
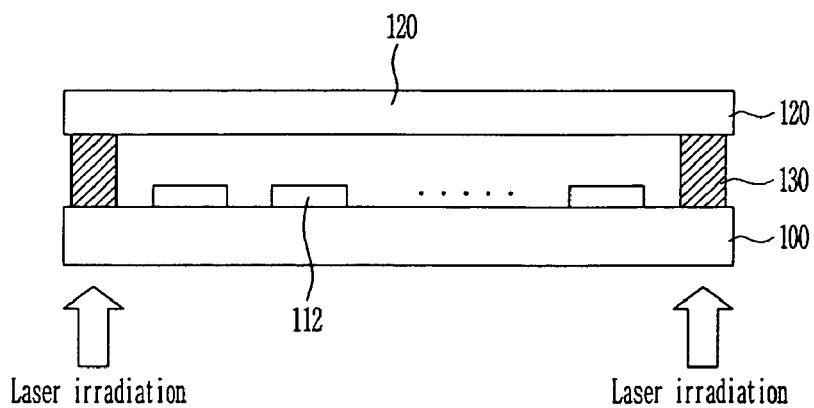

FIG. 3A to 3D are cross section diagrams showing a fabrication process of a flat panel display device according to an embodiment of the present invention. First, as shown in FIG. 3A, on the one side of the substrate 110 is formed a plurality of light emitting elements 112. Here, since each of the light emitting elements 112 formed on the substrate 110 may be an organic light emitting element, the concrete constitution thereof is the same as that described above with reference to FIG. 1 and the description thereof will thus be omitted. Next, the sealing member is prepared to be opposite to the one side of the substrate on which the light emitting elements are formed, as shown in FIG. 3B.

Although the sealing member 120 may be a substrate of a glass material, it is not necessarily limited thereto; however, it may be consisted of plastic or a metal cap, etc. Then, as shown in FIG. 3, the frit pattern 130 is applied to the side toward the substrate 110 of the sealing member 120 and after the frit pattern 130 is applied, the sealing member 120 is bonded to the substrate 110 so that the frit pattern 130 is adhered to the substrate 110. Finally, referring to FIG. 3D, the laser is irradiated along the at least two paths of the frit pattern 130 to irradiate the frit pattern 130. As the melted frit pattern 130 is cured, the substrate 110 is bonded to the sealing member 120. That is, when melting the frit pattern 130, the laser is irradiated along the at least two paths so that the entire frit pattern 130 is included in the energy region of the laser, thereby preventing the incomplete melting of a portion of the frit pattern.

As one example, when the laser is irradiated along the two paths, it is irradiated along one fourth point and three fourth point of the frit pattern so that the entire frit pattern 130 can be included in the effective energy region of the laser. Further, when the laser is irradiated along the two paths, two laser irradiating means are driven at the same time to melt the frit pattern, or the laser is irradiated along a first path to first melt the first region of the frit pattern and after the laser irradiation is completed, the laser is irradiated along a second path to melt the second region of the frit pattern.

Figure 4:
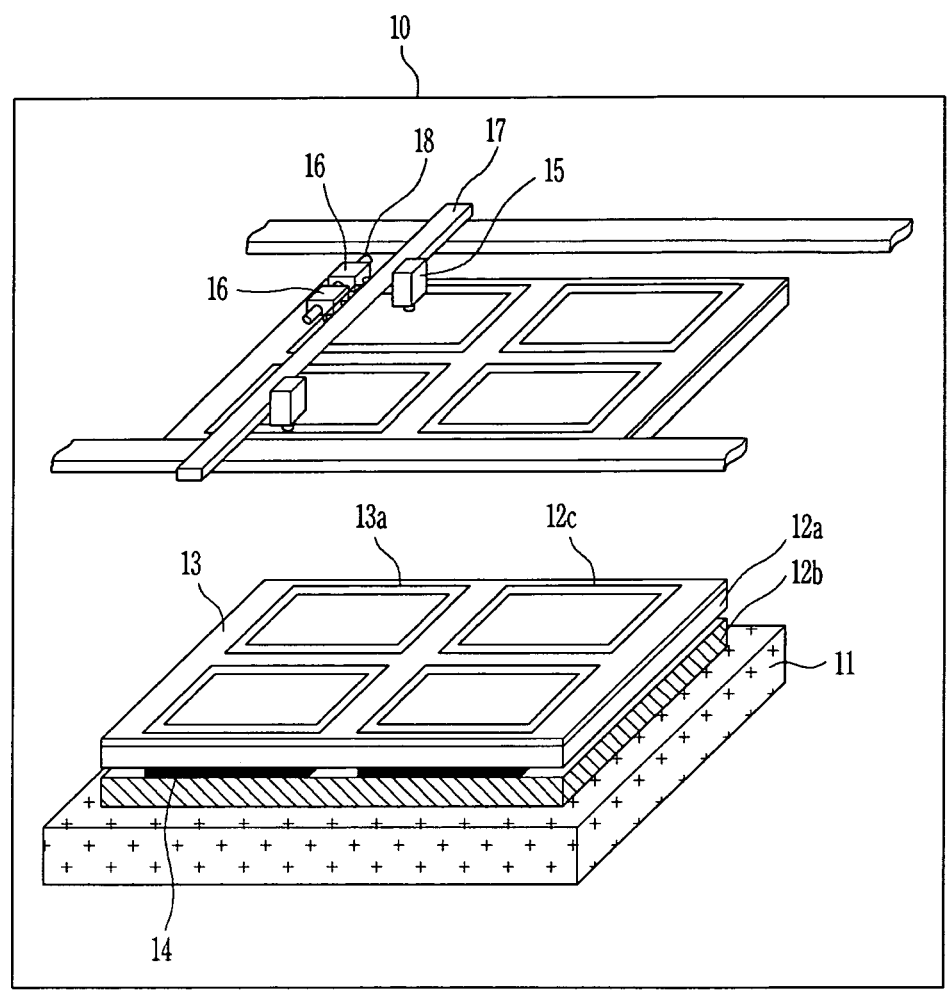
FIG. 4 is a schematic perspective view of a fabrication apparatus of a flat panel display device according to an embodiment of the present invention.

FIG. 4 is a schematic perspective view of a fabrication apparatus of a flat panel display device according to an embodiment of the present invention. However, FIG. 4 is a diagram showing an apparatus for irradiating a laser to the frit pattern to bond the first and second substrates of a flat panel display device, as a fabrication apparatus of a flat panel display device. Referring to FIG. 4, in a laser irradiating apparatus as the flat panel display device according to an embodiment of the present invention, on a substrate stage 11 inside of a chamber 10 is firmly provided a first substrate 12b and a second substrate 12a. On the second substrate 12b is a mask 13 and on the mask 13 is formed a transmission unit transmitting the laser.

A predetermined side of the second substrate 12a corresponding to the transmission unit 13a and irradiated with the laser is a sealing unit 13c. At this time, the first substrate is a substrate comprising a plurality of light emitting units and the second substrate is a sealing member corresponding and bonded to the first substrate. And, the opposite side of the sealing unit 12c of the second substrate 12a is applied with a frit pattern.

In case of the embodiment of the present invention, at least two laser heads 16 is formed as a group, and each of the laser heads is supported by a laser head guides 17, respectively and is mounted to be able to move the upper parts of the substrates 12a and 12b. Although the two laser heads are shown in FIG. 4, it is only one embodiment and is not necessarily limited thereto. Also, a pair of the laser heads is formed on the same line, or can be spaced apart from each other at a constant interval. However, FIG. 1 shows a pair of the laser heads formed on the same line.

Further, the one region of the respective laser head guides 17 is provided with a first CCD camera measuring the position of the mask 13 and is mounted with at lease one first alignment unit 15 aligning the substrates 12a and 12b and the mask 13 by the first CCD camera. Therefore, the first alignment unit 15 aligns the substrates 12a and 12b with the mask 13 in which the shape of the sealing unit 13c is patterned so that the mask and the substrates are conformed. And, the one region of the laser heads 16 is provided with a second CCD camera measuring the position of the substrates 12a and 12b and the laser heads 16 is mounted with at lease one second alignment unit 18 aligning the substrates 12a and 12b and the laser heads 16 by the second CCD camera. Therefore, the second alignment unit 15 aligns the movement positions of the laser heads 16 to conform them to the sealing unit 12c. The position corresponding to the second alignment unit 18 of the laser heads 16 is further provided with a temperature controller (not shown) controlling the temperature inside of the chamber using a temperature sensor.

Also, the substrate stage 11 is formed to be at least larger than the substrates 12a and 12b to support the substrates 12a and 12b, and the mask 13 is formed with the transmission unit 13a corresponding to the pattern of the sealing unit 12c. Although not shown in the drawings, the inside of the chamber 10 performing a laser sealing is provided with a monitoring camera to monitor a sealing process, thereby reducing defective rate of the organic light emitting display device.

The laser irradiating apparatus according to embodiments the present invention is characterized by comprising the at least two laser heads. With this, when melting the frit pattern by the laser irradiation, the respective laser heads irradiate the laser along the at least two paths of the frit pattern, thereby preventing the incomplete melting of the frit pattern. According to embodiments of the present invention, when bonding the substrate and the sealing member, the laser is irradiated along the at least two paths to melt the frit, resulting in that after the frit pattern is cured later, the frit sealing structure having a high sealing effect can be obtained. Further, since the complete sealing is achieved by the frit, the light emitting unit is completely isolated from the external environment. Therefore, a separate desiccant is not required so that the lifetime of the flat panel display device can further be extended.

The detailed description and the drawings of embodiments of the present invention are illustrated, by way of example, to describe embodiments of the present invention, rather than limiting the meanings of the aspects of the present invention or the scope of the present invention defined in the claims.

Although various embodiments of the present invention have been shown and described, it would be appreciated by those skilled in the art that changes might be made in the embodiments without departing from the principles and spirit of the invention, the scope of which is defined in the claims and their equivalents.

What is claimed is:

1. A method of making a flat panel display device, the method comprising:
   providing an unfinished product comprising:
      a first substrate,
      a second substrate opposing the first substrate,
      an array of pixels interposed between the first and second substrates, and
      a frit comprising a plurality of elongated segments, which forms a closed loop surrounding the array and interposed between the first and second substrates, wherein the plurality of elongated segments comprises a first elongated segment extending generally in a first direction, wherein the first elongated segment comprises a first surface, which contacts the first substrate;
   applying a first laser beam to the first elongated segment while moving the first laser beam relative to the first elongated segment, whereby the first laser beam moves generally along the first direction while illuminating a first strip of the first surface, wherein the first strip of the first surface extends generally in the first direction; and
   applying a second laser beam to the first elongated segment while moving the second laser beam relative to the first elongated segment, whereby the second laser beam moves while illuminating a second strip of the first surface.

2. The method of claim 1, wherein applying the first and second laser beams are carried out substantially simultaneously.

3. The method of claim 1, wherein applying the first and second laser beams are carried out using an apparatus comprising:
   a first laser source irradiating the first laser beam;
   a second laser source irradiating the second laser beam; and
   a support coupled to the first and second laser sources and configured to simultaneously move the first and second laser sources along the first direction.

4. The method of claim 1, wherein applying the second laser beam is carried out subsequent to applying the first laser beam.

5. The method of claim 1, wherein the first and second strips overlap with each other.

6. The method of claim 1, wherein the first and second strips do not overlap with each other.

7. The method of claim 1, wherein the first beam is larger than the second beam.

8. The method of claim 1, wherein the first strip has a first central line extending generally in the first direction, and wherein the first central line is located within the second strip.

9. The method of claim 1, wherein the first strip has a first central line extending generally in the first direction, wherein the second strip has a second central line extending generally in the first direction.

10. The method of claim 9, wherein the first surface has a first edge and a second edge, which are substantially parallel to each other and extend generally in the first direction, and wherein the first central line and second central line are located between the first and second edges.

11. The method of claim 10, wherein the first surface has a width, which is a distance between the first and second edges in a second direction, wherein the first central line and the first edge has a first distance therebetween in the second direction, and wherein the first distance is from about one eighth to about three eighth of the width.

12. The method of claim 10, wherein the first surface has a width, which is a distance between the first and second edges in a second direction, wherein the second central line and the first edge has a second distance therebetween in the second direction, and wherein the second distance is from about five eighth to about seven eighth of the width.

13. The method of claim 1, wherein applying the first laser beam causes to melt a portion of the first elongated segment.

14. The method of claim 1, further comprising applying a third laser beam to the first elongated segment while moving the third laser beam relative to the first elongated segment, whereby the third laser beam moves while illuminating a third strip of the first surface.

15. An apparatus of making a flat panel display device according to the method of claim 1, the apparatus comprising:
   a first laser source irradiating the first laser beam;
   a second laser source irradiating the second laser beam; and
   a support coupled to the first and second laser sources and configured to move the first and second laser sources along the first direction.

16. The apparatus of claim 15, wherein the support is configured to move the first and second laser sources simultaneously.

* * * * *